United States Patent [19]
Morino et al.

[11] Patent Number: 5,661,441
[45] Date of Patent: Aug. 26, 1997

[54] DIELECTRIC RESONATOR OSCILLATOR AND METHOD OF MANUFACTURING THE SAME

[75] Inventors: Takayoshi Morino; Yukiro Kashima, both of Osaka, Japan

[73] Assignee: Matsushita Electric Industrial Co., Ltd., Osaka, Japan

[21] Appl. No.: 509,533

[22] Filed: Jul. 31, 1995

[30] Foreign Application Priority Data

Aug. 2, 1994 [JP] Japan ................................. 6-181248

[51] Int. Cl.$^6$ ....................................................... H03B 5/18
[52] U.S. Cl. .................. 331/67; 331/68; 331/96; 331/107 DP; 331/117 D; 333/219.1; 361/743
[58] Field of Search .................. 331/96, 99, 107 DP, 331/107 SL, 117 D, 67, 68; 333/219.1, 247, 250; 361/743, 751, 752, 753, 760

[56] References Cited

U.S. PATENT DOCUMENTS

| 4,307,352 | 12/1981 | Shinkawa et al. | 331/99 |
|---|---|---|---|
| 4,484,162 | 11/1984 | Kamada et al. | 333/219 |
| 4,588,964 | 5/1986 | Hirai et al. | 331/67 |
| 5,208,565 | 5/1993 | Sogo et al. | 333/206 |
| 5,249,100 | 9/1993 | Satoh et al. | 361/689 |
| 5,498,575 | 3/1996 | Onishi et al. | 437/209 |

FOREIGN PATENT DOCUMENTS

| 2438937 | 5/1980 | France . | |
|---|---|---|---|
| 2941826 | 5/1980 | Germany . | |
| 57-194606 | 11/1982 | Japan . | |
| 60-260203 | 12/1985 | Japan . | |
| 63-190405 | 8/1988 | Japan . | |
| 3-192802 | 8/1991 | Japan . | |
| 5251913 | 9/1993 | Japan . | |
| 5304386 | 11/1993 | Japan . | |

OTHER PUBLICATIONS

W. Goedbloed et al., "Microwave Integrated Circuits—Design and Realisation", Electronic Components And Applications, vol. 5, No. 2, Feb. 1983, pp. 85–99.

*Primary Examiner*—Siegfried H. Grimm
*Attorney, Agent, or Firm*—Ratner & Prestia

[57] ABSTRACT

A microwave oscillator includes a substrate having a circuit pattern on the top surface, a thin copper foil covering the bottom surface, and a hole. An electronic component is mounted to the top surface of the substrate. A metal plate is attached to the bottom surface of the substrate thereby closing the bottom of the hole. A dielectric resonator is attached to the metal plate through the hole. Since the dielectric resonator is attached to the metal plate by soldering, the bond between the dielectric resonator and the metal plate is stronger and more stable than that achieved by using a conventional adhesive. This enhances the reliability against temperature changes; mechanical impact or humidity.

10 Claims, 2 Drawing Sheets

DIELECTRIC RESONATOR OSCILLATOR AND METHOD OF MANUFACTURING THE SAME

BACKGROUND OF THE INVENTION

1. Field of the Invention

The present invention relates to a microwave oscillator, and a method of manufacturing the microwave oscillator, used in high frequency communication apparatus, broadcasting apparatus and the like.

2. Description of the Related Art

FIG. 3 shows a conventional microwave oscillator. A substrate 34 having a circuit pattern (not shown in the drawing) and an electronic component 35 soldered thereon is fixed to the bottom of a case 37 using, for example, screws (not shown in the drawing). A bottom 32 of a dielectric resonator 31 is fixed to the bottom of the case 37 using an adhesive 33 (such as epoxy resin). A hole 36 in the substrate 34 allows the dielectric resonator 31 to contact case 37. A shield plate 38 (made from a metal such as aluminum) seals the top of the case 37 and is attached using, for example, screws (not shown in the drawing).

SUMMARY OF THE INVENTION

The invention relates to a microwave oscillator comprising:

a substrate having a circuit pattern on the top surface, a thin copper foil covering the bottom surface, and a hole, an electronic component mounted on the top surface of the substrate, a metal plate attached to the bottom surface of the substrate thereby closing the bottom of the hole, and a dielectric resonator attached to the metal plate through the hole.

The dielectric resonator is attached to the metal plate by soldering, which provides a stronger and more stable connection than conventional adhesives. As a result, the microwave oscillator of the present invention has a high reliability against temperature changes, mechanical impact or humidity.

According to the method of manufacturing the microwave oscillator of the present invention, in the first step, a lamination composed of the substrate and the metal plate is prepared. In the next step, soldering of the electronic component, soldering of the dielectric resonator, and soldering of the shield case are conducted at the same time. Accordingly, the manufacturing time is reduced when compared with the conventional process which performs each of these steps separately.

BRIEF DESCRIPTION OF THE DRAWINGS oscillator of the present invention.

DETAILED DESCRIPTION

Figure 1:
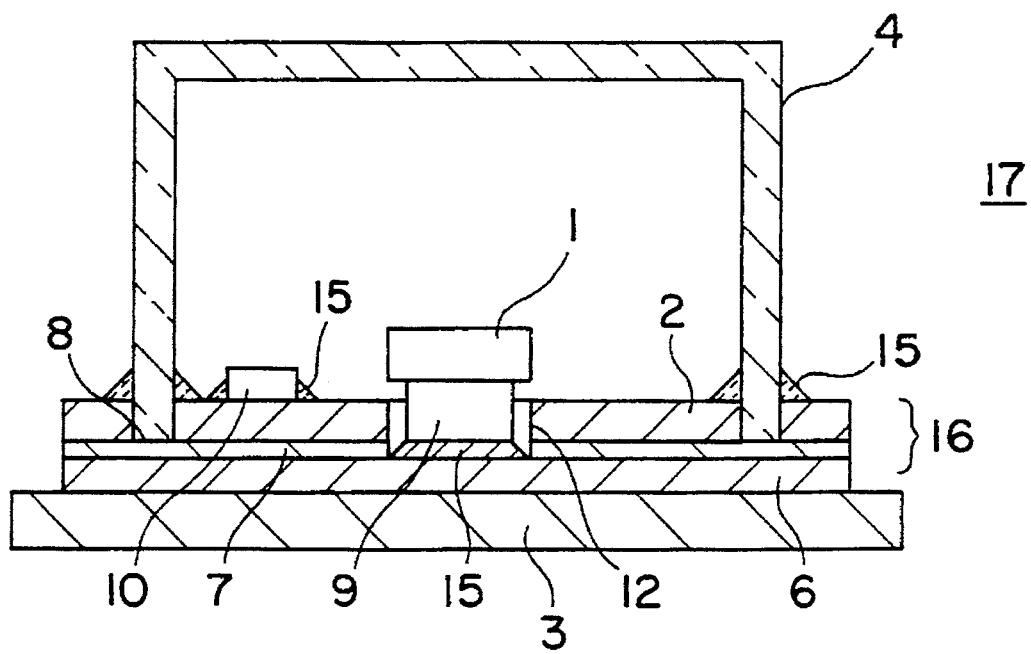
FIG. 1 is a cross-sectional view of a microwave microwave oscillator of the present invention.
Figure 3:
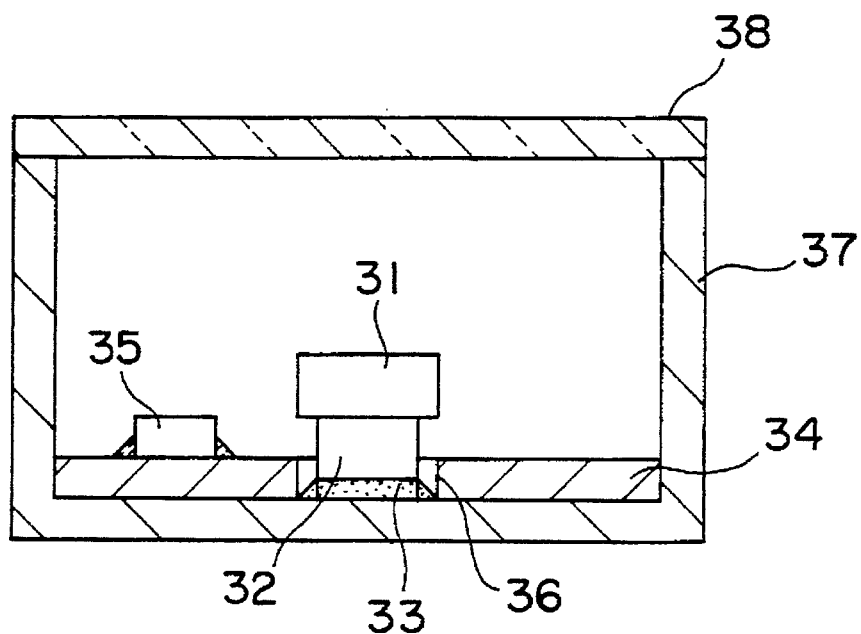
FIG. 3 is a cross-sectional view of a conventional microwave oscillator.
Figure 2:
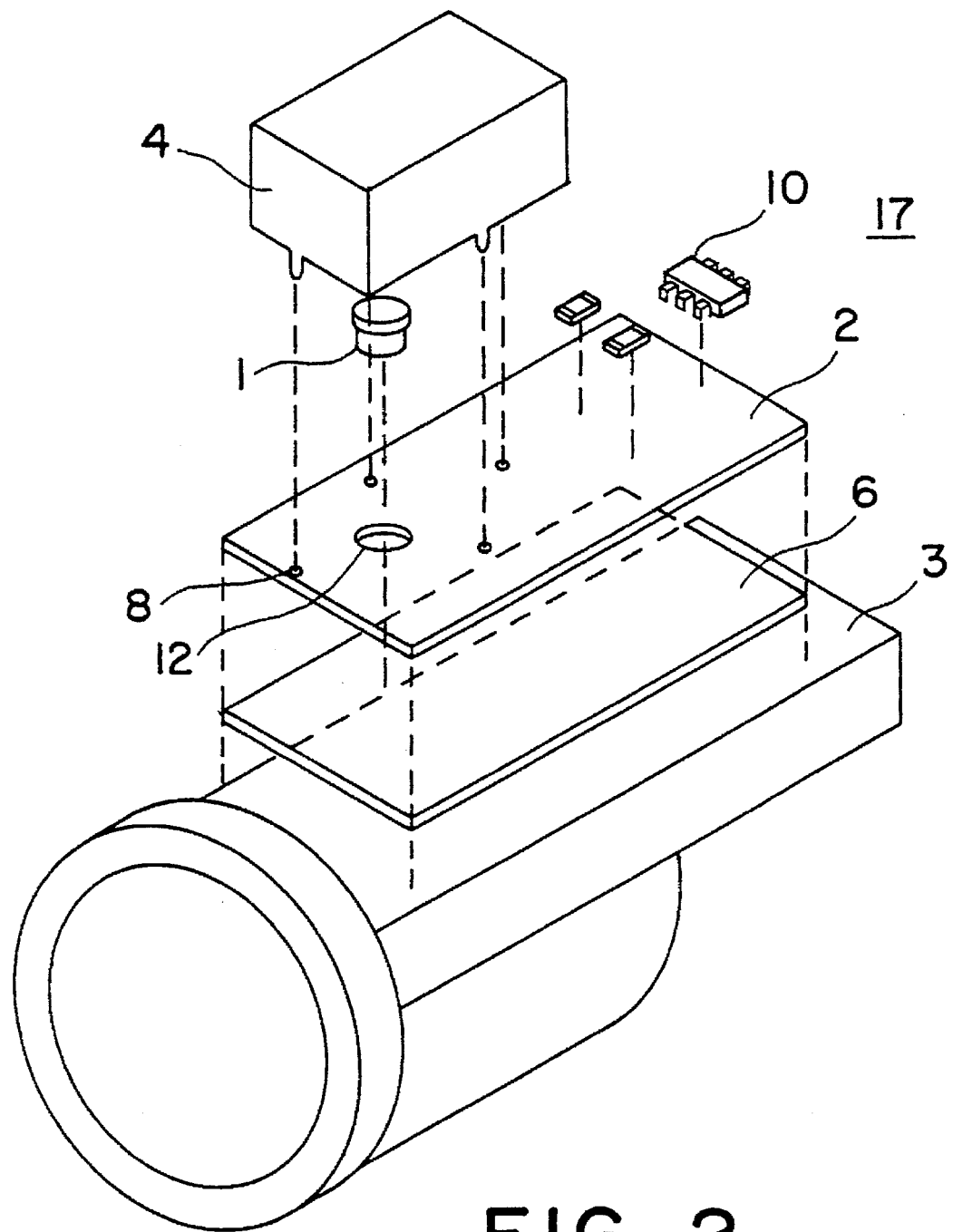
FIG. 2 is a perspective exploded view of the microwave oscillator of the present invention.

FIG. 1 is a microwave oscillator 17 of the present invention. FIG. 2 is a perspective exploded view of the microwave oscillator of the present invention. The manufacturing of the microwave oscillator is explained below with reference to FIGS. 1 and 2. The manufacturing comprises the following steps.

(Step 1) A substrate 2 has a circuit pattern (not shown in the drawings) on the top surface, a thin copper foil (not shown in the drawings) covering the bottom surface, and a hole 12. The thin copper foil bonded to the bottom surface of the substrate 2 allows substrate 2 to be soldered to metal plate 6. A metal plate 6 (made of copper, brass, aluminum, galvanized steel, zinc solder-plated steel, or the like) has outer dimensions equal to or slightly larger than that of the substrate 2. A lamination 16 is prepared by stacking the substrate 2 and the metal plate 6 and soldering them using high temperature melting cream solder 7. The metal plate 6 closes the bottom of the hole 12. Instead of cream solder 7, a sheet solder formed in the same shape as the dielectric substrate 2 can be used. The lamination 16 can also be formed by adhering the substrate 2 and the metal plate 6 with a conductive adhesive instead of solder.

(Step 2) Cream solder 15 is applied to specified positions on the top surface of the substrate 2, and electronic components 10 such as a chip resistor, a transistor, an integrated circuit (IC), etc are mounted on substrate 2. Only one electronic component 10 is shown in FIG. 1 for convenience. The melting point of the cream solder 15 is lower than that of the cream solder 7. A dielectric resonator 1 having cream solder 15 applied to its bottom 9 is mounted on the metal plate 6 through the hole 12 in the substrate 2. The hole 12 in the substrate 2 sets the position of the dielectric resonator 1 by accommodating the bottom 9. The leads of the dielectric resonator 1 (not shown in the drawings) are connected to the circuit pattern on the substrate 2 through the cream solder 15 applied to the substrate 2. A shield case 4 is mounted on the substrate 2 by inserting protrusions on shield case 4 into holes 8 in substrate 2 as shown in FIG. 2. As shown in FIG. 1, the cream solder 15 is applied to the inside and vicinity of the perforated hole 8.

(Step 3) The lamination 16 shown in FIG. 1, on which the electronic component 10 and shield case 4 are mounted, is heated for a short time, so that the cream solder 15 is melted. As a result, the leads of the dielectric resonator 1 and the electronic component 10 are connected to the circuit pattern (not shown in the drawings) on the substrate 2. At the same time, the bottom 9 of the dielectric resonator 1 is soldered to the metal plate 6, and the shield case 4 is soldered to the substrate 2 and metal plate 6. The shield case 4 is electrically coupled to the metal plate 6 resulting in the dielectric resonator 1 and the electronic components 10 on the substrate being shielded by the shield case 4 and the metal plate 6. During this brief heating period, the cream solder 7 between the substrate 2 and the metal plate 6 does not melt because the temperature does not reach the high melting temperature of cream solder 7.

(Step 4) As shown in FIG. 2, oscillator 17 is attached to a mounting plate 3 on a wave guide by using, for example, screws (not shown in the drawing).

The microwave oscillator of the present invention is manufactured according to the above steps. At step 3, soldering of the electronic component 10, soldering of the dielectric resonator 1, and soldering of the shield case 4 are all performed at the same time. Accordingly, the manufacturing time is reduced when compared to the conventional process which performs each of these steps separately.

It is sometimes necessary to leave the substrate 2 exposed after the electronic components 10 are soldered to the substrate 2 to allow for inspection and adjustment of the electronic components 10. In this case, the shield case 4 is assembled independently in a final step.

Since the dielectric resonator 1 is attached to the metal plate 6 by soldering, the bond between the dielectric resonator 1 and the metal plate is stronger and more stable than that achieved with conventional adhesives, thereby enhancing the reliability against temperature changes, mechanical impact, or humidity.

What is claimed:

1. A microwave oscillator comprising:

a substrate having a hole formed therein, an electronic component mounted on a top surface of the substrate by soldering using a first solder, a metal plate attached to a bottom surface of the substrate thereby closing the bottom of the hole, a dielectric resonator soldered to the metal plate using the first solder and at least a portion of the dielectric resonator situated in the hole, a shield case attached to the substrate by soldering using the first solder, the shield case covering the top surface of the substrate and the dielectric resonator, the shield case and the metal plate electromagnetially shielding the substrate and the dielectric resonator, wherein the electronic component is mounted to the top surface of the substrate, the dielectric resonator is soldered to the metal plate, and the shield case is attached to the substrate simultaneously.

2. A microwave oscillator of claim 1, wherein the outer dimensions of the metal plate are equal to or larger than the outer dimensions of the substrate.

3. A microwave oscillator of claim 1, wherein the metal plate is attached to the bottom surface of the substrate by soldering using a second solder, the melting point of the second solder being higher than the first solder.

4. A microwave oscillator of claim 1, wherein the metal plate is attached to the bottom surface of the substrate by a conductive adhesive.

5. A microwave oscillator of claim 1, wherein the shield case is electrically coupled to the metal plate.

6. A method of manufacturing a microwave oscillator comprising the steps of:

(1) fabricating a lamination composed of a substrate having a hole, and a metal plate attached to a bottom surface of the substrate thereby closing the bottom of the hole, (2) applying a solder to an electronic component positioned on a top surface of the substrate, (3) mounting a dielectric resonator, coated with the solder, to the metal plate through the hole in the substrate, (4) mounting a shield case, coated with the solder, to the substrate for covering the top surface of the substrate and the dielectric resonator, and (5) heating the lamination including the mounted electronic component and the dielectric resonator, thereby soldering the electronic component to the top surface of the substrate, soldering the dielectric resonator to the metal plate, and soldering the shield case to the substrate simultaneously.

7. A method of manufacturing a microwave oscillator of claim 6, wherein the lamination comprises:

a substrate, and a metal plate soldered to the bottom surface of the substrate.

8. A method of manufacturing a microwave oscillator of claim 6, wherein the lamination comprises:

a substrate, and a metal plate attached to the bottom surface of the substrate by a conductive adhesive.

9. A method of manufacturing a microwave oscillator of claim 7, wherein the melting point of the solder for attaching the metal plate to the bottom surface of the substrate is higher than the melting point of the solder for attaching the dielectric resonator to the metal plate, the melting point of the solder for attaching the electronic component to the substrate, and the melting point of the solder for attaching the shield case to the substrate.

10. A method of manufacturing a microwave oscillator of claim 7, wherein the melting point of the solder for attaching the metal plate to the bottom surface of the substrate is higher than the melting point of the solder for attaching the electronic component to the substrate.

* * * * *